United States Patent
Yoon et al.

(10) Patent No.: US 11,923,189 B2
(45) Date of Patent: Mar. 5, 2024

(54) CAPPING LAYER FOR A HAFNIUM OXIDE-BASED FERROELECTRIC MATERIAL

(71) Applicant: LAM RESEARCH CORPORATION, Fremont, CA (US)

(72) Inventors: Hyungsuk Alexander Yoon, San Jose, CA (US); Zhongwei Zhu, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 654 days.

(21) Appl. No.: 17/042,283

(22) PCT Filed: Mar. 26, 2019

(86) PCT No.: PCT/US2019/023992
§ 371 (c)(1),
(2) Date: Sep. 28, 2020

(87) PCT Pub. No.: WO2019/195025
PCT Pub. Date: Oct. 10, 2019

(65) Prior Publication Data
US 2021/0020433 A1 Jan. 21, 2021

Related U.S. Application Data

(60) Provisional application No. 62/651,466, filed on Apr. 2, 2018.

(51) Int. Cl.
*H01L 21/02* (2006.01)
*C23C 16/40* (2006.01)
(Continued)

(52) U.S. Cl.
CPC ........ *H01L 21/02181* (2013.01); *C23C 16/40* (2013.01); *C23C 16/45536* (2013.01);
(Continued)

(58) Field of Classification Search
CPC ......... H01L 21/02181; H01L 21/28185; H01L 21/31116; H01L 21/02356;
(Continued)

(56) References Cited

U.S. PATENT DOCUMENTS 7,098,496 B2  8/2006  Li et al.
7,709,402 B2  5/2010  Ahn et al.
(Continued)

FOREIGN PATENT DOCUMENTS

| | | |
|---|---|---|
| JP | 2004-356558 A | 12/2004 |
| JP | 2008-532282 A | 8/2008 |
| JP | 2014-053568 A | 3/2014 |

OTHER PUBLICATIONS

Staffa, J., et al. "Temperature Dependence of the Etch Rate and Selectivity of Silicon Nitride over Silicon Dioxide in Remote Plasma NF3/Cl2." *Applied Physics Letters*, vol. 67, No. 13, Sep. 25, 1995, pp. 1902-1904., doi:10.1063/1.114371.
(Continued)

*Primary Examiner* — Mohammad A Rahman

(57) ABSTRACT

A method of forming ferroelectric hafnium oxide (HfO2) in a substrate processing system includes depositing an HfO2 layer on a substrate, depositing a capping layer on the HfO2 layer, annealing the HfO2 layer and the capping layer to form ferroelectric hafnium HfO2, and selectively etching the capping layer to remove the capping layer without removing the HfO2 layer.

20 Claims, 5 Drawing Sheets

(51) Int. Cl.
*C23C 16/455* (2006.01)
*C23C 16/56* (2006.01)
*H01L 21/28* (2006.01)
*H01L 21/311* (2006.01)

(52) U.S. Cl.
CPC ........ *C23C 16/56* (2013.01); *H01L 21/28185* (2013.01); *H01L 21/31116* (2013.01)

(58) Field of Classification Search
CPC ......... H01L 21/02362; H01L 21/02164; H01L 21/0217; H01L 21/02178; H01L 21/02315; H01L 21/3065; H01L 21/32136; H01L 21/324; H01L 21/67017; H01L 21/28; H01L 21/02; H01L 21/3213; C23C 16/40; C23C 16/45536; C23C 16/56
See application file for complete search history.

(56) References Cited

U.S. PATENT DOCUMENTS

| | | | |
|---|---|---|---|
| 9,443,736 B2 | 9/2016 | Cameron et al. | |
| 2005/0026458 A1* | 2/2005 | Basceri | H10B 12/033 |
| | | | 257/E21.018 |
| 2008/0023744 A1 | 1/2008 | Shin et al. | |
| 2008/0251836 A1* | 10/2008 | Park | H01L 29/66833 |
| | | | 257/E21.294 |
| 2012/0153249 A1* | 6/2012 | Zhang | H10N 70/021 |
| | | | 257/E47.001 |
| 2012/0299113 A1 | 11/2012 | Endo et al. | |
| 2012/0306027 A1* | 12/2012 | Kronholz | H01L 29/665 |
| | | | 257/E21.409 |
| 2015/0076437 A1 | 3/2015 | Tao et al. | |
| 2015/0179935 A1* | 6/2015 | Hong | H10N 70/826 |
| | | | 257/2 |
| 2015/0214322 A1* | 7/2015 | Mueller | H01L 29/516 |
| | | | 257/532 |
| 2016/0218283 A1* | 7/2016 | Trinh | H10N 70/8833 |
| 2016/0240428 A1* | 8/2016 | Tung | H01L 21/7682 |
| 2017/0110335 A1* | 4/2017 | Yang | H01J 37/321 |
| 2018/0090591 A1* | 3/2018 | Ando | H01L 29/66545 |
| 2021/0082920 A1* | 3/2021 | Nonaka | H01L 29/78648 |

OTHER PUBLICATIONS

Kastenmeier, B. E. E., et al. "Highly Selective Etching of Silicon Nitride over Silicon and Silicon Dioxide." *Journal of Vacuum Science & Technology A: Vacuum, Surfaces, and Films*, vol. 17, No. 6, 1999, pp. 3179-3184., doi:10.1116/1.582097.

Efrain Altamirano and Eddy Kunnen. "Towards the Understanding of CH3F/O2 Chemistry." 2018, pp. 1-2.

Maeda, Takeshi, et al. "Selective Dry Etching of HfO2 in CF4, Cl2 and HBr Based Chemistry." *Extended Abstracts of the 2003 International Conference on Solid State Devices and Materials*, 2003, pp. 828-829., doi:10.7567/ssdm.2003.d-10-4.

International Search Report and Written Opinion of the ISA issued in PCT/US2019/023992, dated Jul. 9, 2019; ISA/KR.

Office Action from corresponding Korean Application No. 10-2020-701549, dated Oct. 10, 2023.

* cited by examiner

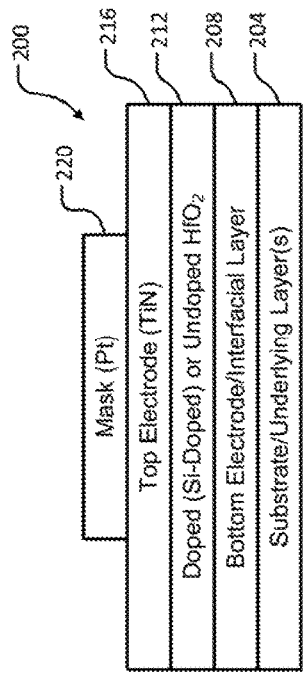
FIG. 2D
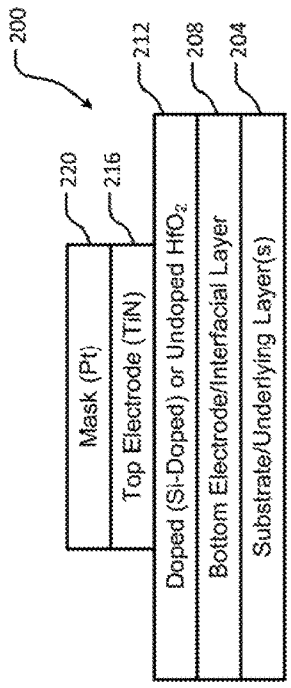
FIG. 2E
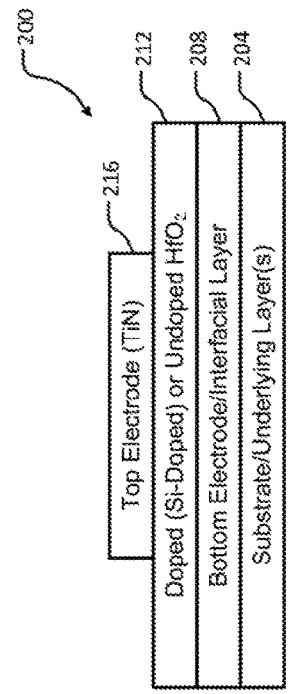
FIG. 2F
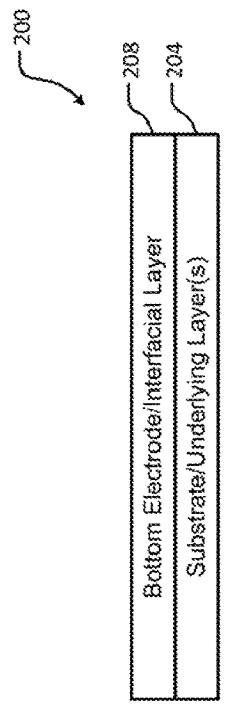
FIG. 2A
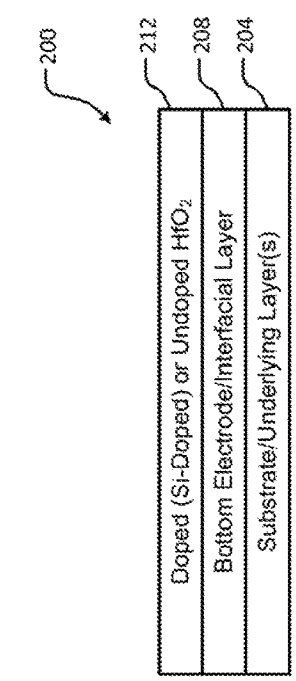
FIG. 2B
FIG. 2C

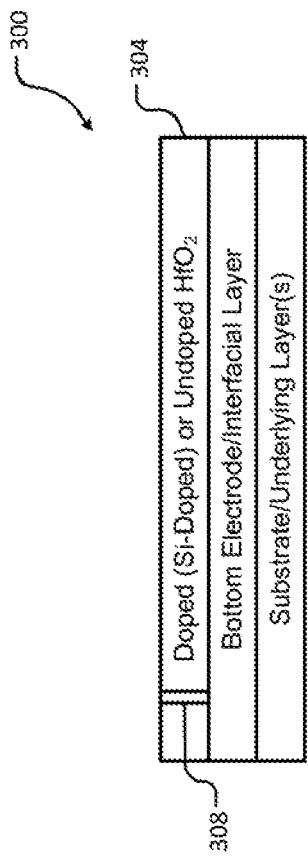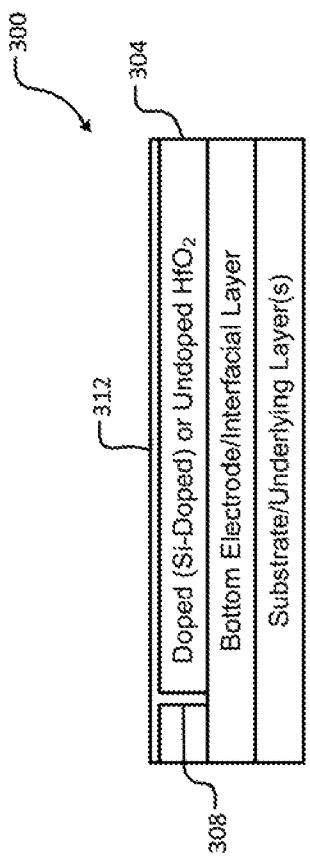

CAPPING LAYER FOR A HAFNIUM OXIDE-BASED FERROELECTRIC MATERIAL

CROSS-REFERENCE TO RELATED APPLICATIONS

This application is a U.S. National Phase Application under 35 U.S.C. 371 of International Application No. PCT/US2019/023992, filed on Mar. 26, 2019, which claims the benefit of U.S. Provisional Application No. 62/651,466, filed on Apr. 2, 2018. The entire disclosures of the applications referenced above are incorporated herein by reference.

FIELD

The present disclosure relates to methods for processing substrates, and more particularly to methods for reducing leakage current in hafnium oxide-based ferroelectric material.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The discovery of ferroelectric behavior in hafnium oxide ($HfO_2$)-based materials rejuvenated research into ferroelectric memory (FeRAM). Conventional ferroelectric materials such as lead zirconate titanate (PZT) do not have an adequate switching window for thicknesses below 50 nanometers (nm). Therefore PZT cannot be used for devices having features sizes that are less than 50 nm.

$HfO_2$ has excellent ferroelectric switching hysteresis down to thicknesses of 6 nm due to a high coercive field. $HfO_2$ is also a good candidate for 3D memory structures. $HfO_2$ has been widely used in CMOS technology as a gate dielectric. In these applications, $HfO_2$ is deposited using conformal atomic layer deposition (ALD). Therefore, $HfO_2$ may be suitable for integration into 3D FeRAM using the current 3D NAND integration schemes.

SUMMARY

A method of forming ferroelectric hafnium oxide ($HfO_2$) in a substrate processing system includes depositing an $HfO_2$ layer on a substrate, depositing a capping layer on the $HfO_2$ layer, annealing the $HfO_2$ layer and the capping layer to form ferroelectric hafnium $HfO_2$, and selectively etching the capping layer to remove the capping layer without removing the $HfO_2$ layer.

In other features, the capping layer comprises a material selected from a group consisting of silicon nitride (SiN), silicon dioxide ($SiO_2$), and aluminum oxide ($Al_2O_3$). The capping layer does not include either of titanium and tantalum. The method further includes nitridating the $HfO_2$ layer prior to depositing the capping layer. The method further includes depositing a top electrode on the $HfO_2$ layer subsequent to removing the capping layer. The top electrode comprises a material selected from a group consisting of titanium, tantalum, and tungsten.

In other features, selectively etching the capping layer includes wet etching the capping layer using a diluted hydrofluoric acid solution. Selectively etching the capping layer includes dry plasma etching the capping layer using a plasma generated with at least one of a fluorocarbon plasma and a halogen plasma. Annealing the $HfO_2$ layer and the capping layer to form ferroelectric hafnium $HfO_2$ includes performing a rapid thermal annealing process at a temperature within a range of 500 and 1000° C.

In other features, the method further includes depositing a bottom electrode on the substrate, wherein depositing the $HfO_2$ layer includes depositing the $HfO_2$ layer on the bottom electrode. The method further includes performing a plasma treatment of the $HfO_2$ layer prior to depositing the capping layer. The method further includes repairing the $HfO_2$ layer subsequent to selectively etching the capping layer and depositing a top electrode on the $HfO_2$ layer subsequent to repairing the $HfO_2$ layer. Repairing the $HfO_2$ layer includes depositing additional $HfO_2$ material onto the $HfO_2$ layer.

A system configured to form ferroelectric hafnium oxide ($HfO_2$) on a substrate in a processing chamber includes a gas delivery system configured to supply process gases to the processing chamber and a radio frequency (RF) generating system configured to selectively generate plasma within the processing chamber. A controller is configured to, by controlling the gas delivery system and the RF generating system, deposit an $HfO_2$ layer on the substrate, deposit a capping layer on the $HfO_2$ layer, anneal the $HfO_2$ layer and the capping layer to form ferroelectric hafnium $HfO_2$, and selectively etch the capping layer to remove the capping layer without removing the $HfO_2$ layer.

In other features, the capping layer comprises a material selected from a group consisting of silicon nitride (SiN), silicon dioxide ($SiO_2$), and aluminum oxide ($Al_2O_3$). The capping layer does not include either of titanium and tantalum. The controller is further configured to nitridate the $HfO_2$ layer prior to depositing the capping layer. The controller is further configured to deposit a top electrode on the $HfO_2$ layer subsequent to removing the capping layer. The top electrode comprises a material selected from a group consisting of titanium, tantalum, and tungsten.

In other features, selectively etching the capping layer includes wet etching the capping layer using a diluted hydrofluoric acid solution. Selectively etching the capping layer includes dry plasma etching the capping layer using a plasma generated with at least one of a fluorocarbon plasma and a halogen plasma. Annealing the $HfO_2$ layer and the capping layer to form ferroelectric hafnium $HfO_2$ includes performing a rapid thermal annealing process at a temperature within a range of 500 and 1000° C.

In other features, the controller is further configured to deposit a bottom electrode on the substrate, wherein depositing the $HfO_2$ layer includes depositing the $HfO_2$ layer on the bottom electrode. The controller is further configured to perform a plasma treatment of the $HfO_2$ layer prior to depositing the capping layer. The controller is further configured to repair the $HfO_2$ layer subsequent to selectively etching the capping layer and deposit a top electrode on the $HfO_2$ layer subsequent to repairing the $HfO_2$ layer. Repairing the $HfO_2$ layer includes depositing additional $HfO_2$ material onto the $HfO_2$ layer.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A through 2F are side cross-sectional views of an example process for forming a device including ferroelectric $HfO_2$;

FIGS. 3A and 3B are side cross-sectional views of an example process for repairing a ferroelectric $HfO_2$ layer;

In the drawings, reference numbers may be reused to identify similar and/or identical elements.

DETAILED DESCRIPTION

Thermal stability of $HfO_2$ is an obstacle for commercialization in FeRAM applications. Although temperatures of 600-650° C. are high enough to crystallize as-deposited amorphous $HfO_2$ into the ferroelectric phase, many integration schemes require a thermal budget of at least 1000° C. The higher process temperature degrades $HfO_2$-based FeRAM by increasing leakage current and/or shorting the devices. Sources of leakage after high temperature annealing include defect generation at a top electrode/$HfO_2$ interface. Another source of leakage current includes film cracking of $HfO_2$. With the cracking of $HfO_2$, atoms from the top and bottom electrodes (typically TiN) can freely diffuse into $HfO_2$, which eventually fails the device. For example, the top electrode functions as a cap during annealing to prevent transition of the $HfO_2$ layer into a thermodynamically stable monoclinic phase. In the monoclinic phase, $HfO_2$ is not ferrorelectric.

Systems and methods according to the present disclosure implement a capping layer configured to form a ferroelectric $HfO_2$ layer having reduced defects and leakage on a semiconductor substrate. For example, the capping layer may include an oxide and/or a nitride other than TiN or for nitridating the $HfO_2$ layer. For example, the capping layer may include silicon nitride (SiN), silicon dioxide ($SiO_2$), aluminum oxide ($Al_2O_3$), silicon oxynitride ($SiO_xN_y$), aluminum nitride (AlN), aluminum oxynitride ($AlO_xN_y$), etc. In some examples, the capping layer may include titanium or tantalum, such as tantalum pentoxide ($Ta_2O_5$), tantalum oxynitride ($TaO_xN_y$), titanium oxide ($TiO_2$), titantium oxynitride ($TiO_xN_y$), etc. The material of the capping layer is selected such that ferroelectric $HfO_2$ will be formed by annealing the $HfO_2$, the capping layer may be selectively removed (e.g., etched via dry or wet etching) from the $HfO_2$ subsequent to annealing, and atoms in the capping layer do not diffuse into the $HfO_2$ and do not scavenge oxygen atoms from the $HfO_2$. The material of the capping layer may also be selected to reduce interfacial stress and tune grain size and orientation, switching speed, remnant polarization, and other properties of the $HfO_2$.

The capping layer facilitates the formation of orthorhombic ferroelectric $HfO_2$ during annealing while eliminating degradation of the $HfO_2$ caused by Ti diffusion. The capping layer may then be removed and a top electrode is deposited onto the $HfO_2$. In some examples, additional deposition of $HfO_2$ may be performed subsequent to annealing and prior to top electrode deposition to repair any cracking in the $HfO_2$ caused by the annealing. For example, the additional deposition of $HfO_2$ may include performing two or more deposition cycles.

Figure 1:
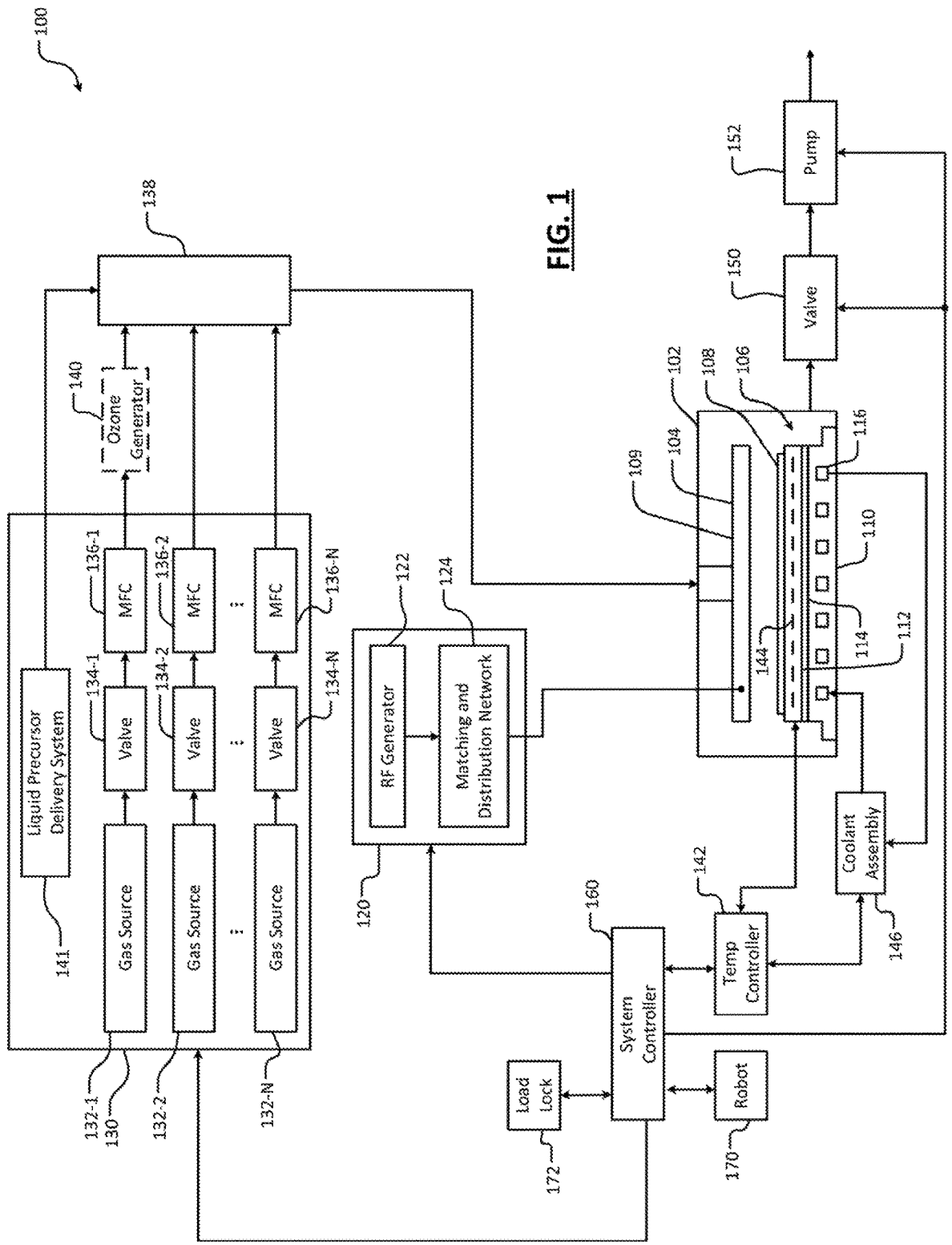
FIG. 1 is a functional block diagram of an example substrate processing system for forming a ferroelectric hafnium oxide ($HfO_2$) layer according to the present disclosure.

FIG. 1 shows an example substrate processing system 100 for depositing and optionally doping an $HfO_2$ layer using atomic layer deposition (ALD) and depositing a capping layer to form ferroelectric $HfO_2$ according to the present disclosure. While the deposition and doping of the $HfO_2$ layer and the deposition of the capping layer are performed in the same processing chamber in this example, separate processing chambers can be used. For example, a transformer coupled plasma (TCP) chamber, a plasma-enhanced chemical vapor deposition (PECVD) chamber, a high pressure CVD (HPCVD) chamber, and/or a processing chamber using a remote plasma source may be used to perform one or more deposition or etching steps described below.

The substrate processing system 100 includes a processing chamber 102 that encloses other components of the substrate processing system 100 and contains the RF plasma. The substrate processing chamber 102 includes an upper electrode 104 and a substrate support, such as an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more deposition precursors and mixtures thereof. The gas precursors may include precursor gases for the $HfO_2$ layer and/or other layers. The gas sources may also supply purge gas and gases including a nitrogen species for plasma nitridation and/or other gas species (such as Ar, $Ar/H_2$, $NH_3$, $O_2$, $O_3$, etc.) for other plasma treatments. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 138. An output of the manifold 138 is fed to the processing chamber 102. For example only, the output of the manifold 138 is fed to the showerhead 109. In some examples, an optional ozone generator 140 may be provided between the mass flow controllers 136 and the manifold 138. In some examples, the substrate processing system 100 may include a liquid precursor delivery system 141. The liquid precursor delivery system 141 may be incorporated within the gas delivery system 130 as shown or may be external to the gas delivery system 130. The liquid precursor delivery system 141 is configured to provide precursors that are liquid and/or solid at room temperature via a bubbler, direct liquid injection, vapor draw, etc.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 (e.g., including a coolant pump, coolant reservoir or source, etc.) to control coolant flow through the channels 116. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172. Although shown as separate controllers, the temperature controller 142 may be implemented within the system controller 160.

Referring now to FIGS. 2A, 2B, 2C, 2D, 2E, and 2F, an example process for forming a ($HfO_2$)-based ferroelectric material in a device 200 is shown. In FIG. 2A, the device 200 includes a substrate (e.g., one or more underlying layers) 204 and an interfacial layer 208 arranged on the underlying layers 204. For example, the underlying layers 204 comprise silicon (Si). In some examples, the interfacial layer 208 corresponds to a bottom electrode including titanium nitride (TiN), tantalum nitride (TaN), or tungsten (W), although other electrode materials can be used. Other examples include, but are not limited to, platinum (Pt), gold (Au), palladium (Pd), aluminum (Al), molybdenum (Mo), nickel (Ni), titanium (Ti), etc. In other examples, the interfacial layer 208 may include silicon dioxide ($SiO_2$) or silicon oxynitride (SiON). In some examples, the interfacial layer 208 is deposited using atomic layer deposition (ALD), chemical vapor deposition (CVD) or physical vapor deposition (PVD). In other examples, the interfacial layer 208 may be formed via thermal oxidation of Si. For example, the interfacial layer 208 may be formed by thermal oxidation of Si in an oxygen environment with a nitrogen species (e.g., $N_2O$ or $N_2$) to form SiON, plasma nitridation of $SiO_2$, etc.

As shown in FIG. 2B, an $HfO_2$ layer 212 is deposited on the interfacial layer 208. In some examples, the deposited $HfO_2$ layer 212 has a thickness in a range from 2 nm to 12 nm. In some examples, the $HfO_2$ layer 212 is doped using a dopant species selected from a group consisting of silicon (Si), aluminum (Al), yttrium (Y), zirconium (Zr), and/or lanthanum (La). In some examples, the $HfO_2$ layer 212 is deposited using atomic layer deposition (ALD), although other processes can be used. For example, thermal ALD or plasma-enhanced ALD can be used. In some examples, the $HfO_2$ layer 212 is undoped. In other examples, the $HfO_2$ layer 212 is doped to a predetermined doping level from greater than 0 mol % to less than or equal to 60 mol % of the selected dopant species. In some examples, the $HfO_2$ layer 212 is doped to a predetermined doping level from 3 mol % to 5 mol % of the selected dopant species. The $HfO_2$ layer 212 may be amorphous.

Plasma treatment of the $HfO_2$ layer 212 may optionally be performed. For example, the $HfO_2$ layer 212 is nitridated by plasma including a nitrogen gas species. For example, molecular nitrogen ($N_2$) gas may be used. In some examples, the nitridation is performed during a predetermined period in a range from 15s to 60s. In some examples, the RF power may be in a range from 100 W to 15 kW. In some examples, the plasma power is in a range from 500 W to 1200 W. In some examples, the RF frequency may be in a range from 1 MHz to 15 MHz. In some examples, the RF frequency is 2.0 MHz and/or 13.56 MHz.

After plasma treatment, a top electrode 216 is deposited on the $HfO_2$ layer 212 as shown in FIG. 2C. In some examples, the top electrode 216 includes TiN, TaN or W, although other electrode materials can be used (e.g., Pt, Au, Pd, Al, Mo, Ni, Ti, etc.). In some examples, the top electrode 216 is deposited using atomic layer deposition (ALD), chemical vapor deposition (CVD), or physical vapor deposition (PVD). After depositing the top electrode 216, the device 200 is annealed at a predetermined temperature in a range from 500° C. to 1100° C. In other examples, the annealing temperature is in a range from 800° C. to 1000° C.

After annealing, the top electrode 216 is patterned as shown in FIGS. 2D, 2E, and 2F. For example, a mask 220 may be deposited as shown in FIG. 2D. The mask 220 may comprise platinum (Pt). The top electrode 216 is etched using wet etching or dry etching as shown in FIG. 2E. In some examples, the mask 220 is optionally removed after etching as shown in FIG. 2F. In other examples, the mask is not removed.

Referring now to FIGS. 3A and 3B, an example process for repairing a device 300 including a ferroelectric $HfO_2$ layer 304 formed in the manner shown in FIGS. 2A-2F is shown. As shown in FIG. 3A, annealing the device 300 (e.g., as described above in FIG. 2C) may cause cracking in the HfO2 layer 304. For example, one or more cracks 308 may extend partially or entirely through the $HfO_2$ layer 304. Accordingly, additional $HfO_2$ deposition steps (e.g., in one or more cycles) may be performed to deposit a thin $HfO_2$ film 312 on the $HfO_2$ layer 304 to fill the cracks 308 and/or repair other defects on the surface of the $HfO_2$ layer 304 as shown in FIG. 3B. The cracks 308 and other defects on the surface of the $HfO_2$ layer 304 (e.g., defects at an interface between the $HfO_2$ layer 304 and a top electrode) may facilitate diffusion of Ti or Ta atoms from the top and bottom electrodes into the $HfO_2$ layer 304, increasing leakage current, shorting of the device 300, etc., and may cause failure of the device 300.

Figure 4A:
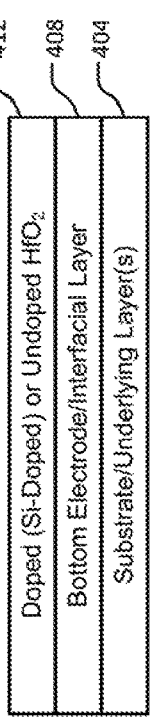
FIGS. 4A through 4F are side cross-sectional views of an example process for forming a device including ferroelectric $HfO_2$ according to the present disclosure.

Referring now to FIGS. 4A, 4B, 4C, 4D, 4E, and 4F, an example process for forming a ($HfO_2$)-based ferroelectric material in a device 400 using a sacrificial capping layer according to the present disclosure is shown. In FIG. 4A, the device 400 includes a substrate (e.g., one or more underlying layers) 404 and an interfacial layer 408 arranged on the underlying layers 404. For example, the underlying layers 404 comprise silicon (Si), germanium (Ge), silicon-germanium ($Si_xGe_{(1-x)}$), etc. In some examples, the interfacial layer 408 corresponds to a bottom electrode including titanium nitride (TiN), tantalum nitride (TaN), or tungsten (W), although other electrode materials can be used (e.g., Pt, Au, Pd, Al, Mo, Ni, Ti, etc.). In other examples, the interfacial layer 408 may include silicon dioxide ($SiO_2$) or silicon oxynitride (SiON). In some examples, the interfacial layer 408 is deposited using atomic layer deposition (ALD), chemical vapor deposition (CVD) or physical vapor deposition (PVD).

Figure 4B:
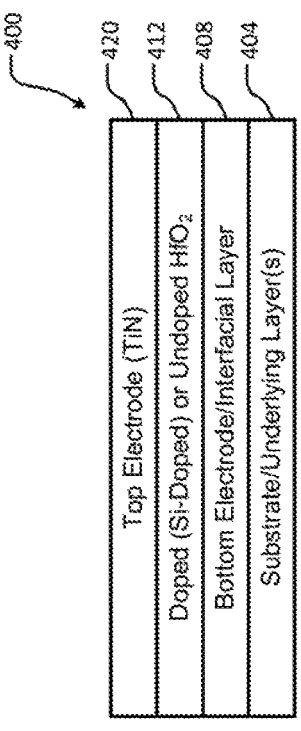

As shown in FIG. 4B, an $HfO_2$ layer 412 is deposited on the interfacial layer 408. In some examples, the deposited $HfO_2$ layer 412 has a thickness in a range from 2 nm to 12 nm. In some examples, the $HfO_2$ layer 412 is doped using a dopant species selected from a group consisting of silicon (Si), aluminum (Al), yttrium (Y), zirconium (Zr), and/or lanthanum (La). In some examples, the $HfO_2$ layer 412 is deposited using atomic layer deposition (ALD), although other processes can be used. For example, thermal ALD or plasma-enhanced ALD can be used. In some examples, the $HfO_2$ layer 412 is undoped. In other examples, the $HfO_2$ layer 412 is doped to a predetermined doping level from greater than 0 mol % to less than or equal to 60 mol % of the selected dopant species. In some examples, the $HfO_2$ layer 412 is doped to a predetermined doping level from 3 mol % to 5 mol % of the selected dopant species. The $HfO_2$ layer 412 may be amorphous.

Plasma treatment of the $HfO_2$ layer 412 may optionally be performed. For example, the $HfO_2$ layer 412 is nitridated by plasma including a nitrogen gas species. For example, molecular nitrogen ($N_2$) gas may be used. In some examples, the nitridation is performed during a predetermined period in a range from 15s to 60s. In some examples, the RF power may be in a range from 100 W to 15 kW. In some examples, the plasma power is in a range from 500 W to 1200 W. In some examples, the RF frequency may be in a range from 1 MHz to 15 MHz. In some examples, the RF frequency is 2.0 MHz and/or 13.56 MHz.

Figure 4C:
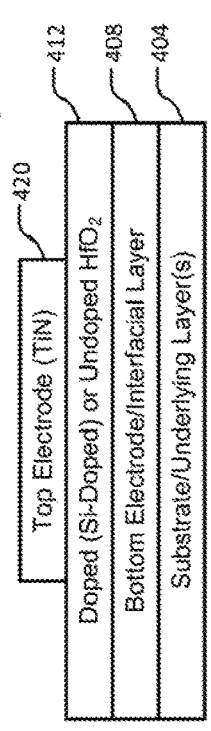

After plasma treatment, a capping layer 416 (e.g., a sacrificial dielectric layer) is deposited on the $HfO_2$ layer 412 as shown in FIG. 4C. In some examples, the capping layer 416 includes an oxide and/or a nitride other than TiN for nitridating the $HfO_2$ layer. For example, the capping layer 416 may include silicon nitride (SiN), silicon dioxide ($SiO_2$), aluminum oxide ($Al_2O_3$), silicon oxynitride ($SiO_xN_y$), aluminum nitride (AlN), aluminum oxynitride ($AlO_xN_y$), tantalum pentoxide ($Ta_2O_5$), tantalum oxynitride ($TaO_xN_y$), titanium oxide ($TiO_2$), titanium oxynitride ($TiO_xN_y$), etc. In some examples, the capping layer 416 is deposited using atomic layer deposition (ALD), chemical vapor deposition (CVD), or physical vapor deposition (PVD). After depositing the capping layer 416, the device 400 is annealed at a predetermined temperature in a range from 500° C. to 1100° C. to form ferroelectric $HfO_2$. In other examples, the annealing temperature is in a range from 800° C. to 1000° C.

Figure 4D:
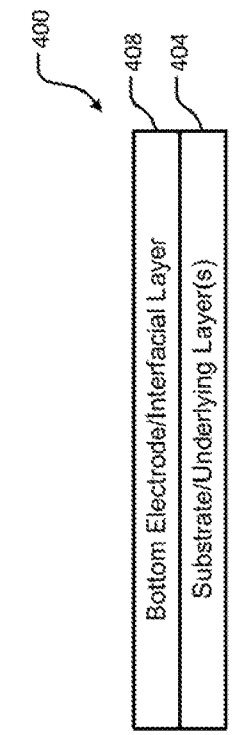

After annealing, the capping layer 416 is removed (e.g., via dry or wet etching) from the $HfO_2$ layer 412 as shown in FIG. 4D. For example, the removal of the capping layer 416 may be performed in a different processing chamber than the deposition of the $HfO_2$ layer 412 and the capping layer 416. The etching may be performed using a material configured to selectively remove the capping layer 416 without removing the $HfO_2$ layer 412. In other words, etching is configured for selective etching of the material of the capping layer 416.

In an example wet etching process, a diluted hydrofluoric acid (HF) solution may be supplied to the processing chamber for selective etching of a capping layer 416 comprising SiN. In one example, the diluted hydrofluoric acid solution may comprise hydrofluoric acid dissolved in an aqueous or non-aqueous (e.g., alcohol) solvent. The ratio of the solvent to the hydrofluoric acid in the solution may be between 10:1 and 100:1. The diluted hydrofluoric acid solution is selective for etching SiN. Conversely, $HfO_2$ is stable in diluted hydrofluoric acid. For example, ten minutes of exposure to wet etching using diluted hydrofluoric acid may result in less than 0.2 nm of material being etched from the $HfO_2$ layer 412 while completely removing the capping layer 416.

Example dry plasma etching processes configured to selectively etch SiN over $HfO_2$ may use, but are not limited to, plasmas generated with fluoromethane ($CH_3F$) and molecular oxygen ($O_2$), nitrogen trifluoride ($NF_3$) and chlorine ($Cl_2$), $NF_3$ and $O_2$, and tetrafluoromethane ($CF_4$) and $O_2$. An example dry plasma etching process configured to selectively etch $SiO_2$ over $HfO_2$ may use plasma generated with $CF_4$ and $O_2$. Conversely, plasmas generated with boron trichloride ($BCl_3$) may substantially etch the $HfO_2$ layer 412. Accordingly, suitable plasmas for selectively dry plasma etching SiN over $HfO_2$ may include fluorocarbon and/or halogen plasmas.

After removal of the capping layer 416, one or more additional repair and/or cleaning steps may be performed to repair any damage that may have been caused to the $HfO_2$ layer 412 during the annealing and the etching of the capping layer 416. For example, the repair steps may include performing one or more $HfO_2$ deposition cycles to deposit additional $HfO_2$ material on the $HfO_2$ layer 412.

Figure 4E:
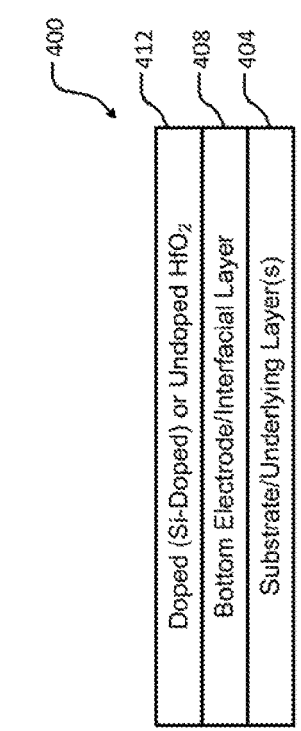
Figure 4F:
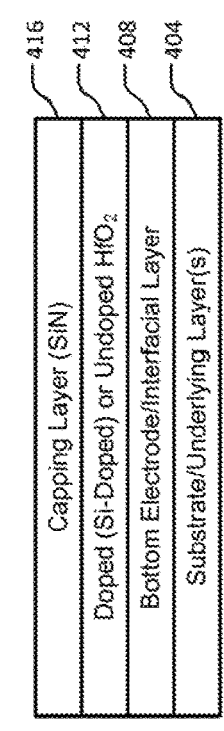

A top electrode 420 is then deposited on the $HfO_2$ layer 412 as shown in FIG. 4E. In some examples, the top electrode 420 includes TiN, TaN or W, although other electrode materials can be used (e.g., Pt, Au, Pd, Al, Mo, Ni, Ti, etc.). In some examples, the top electrode 420 is deposited using atomic layer deposition (ALD), chemical vapor deposition (CVD), or physical vapor deposition (PVD). After depositing the top electrode 420, the top electrode 420 may be patterned as shown in FIG. 4F (e.g., by depositing a mask on the top electrode 420, etching the top electrode 420, removing the mask, etc.).

Figure 5:
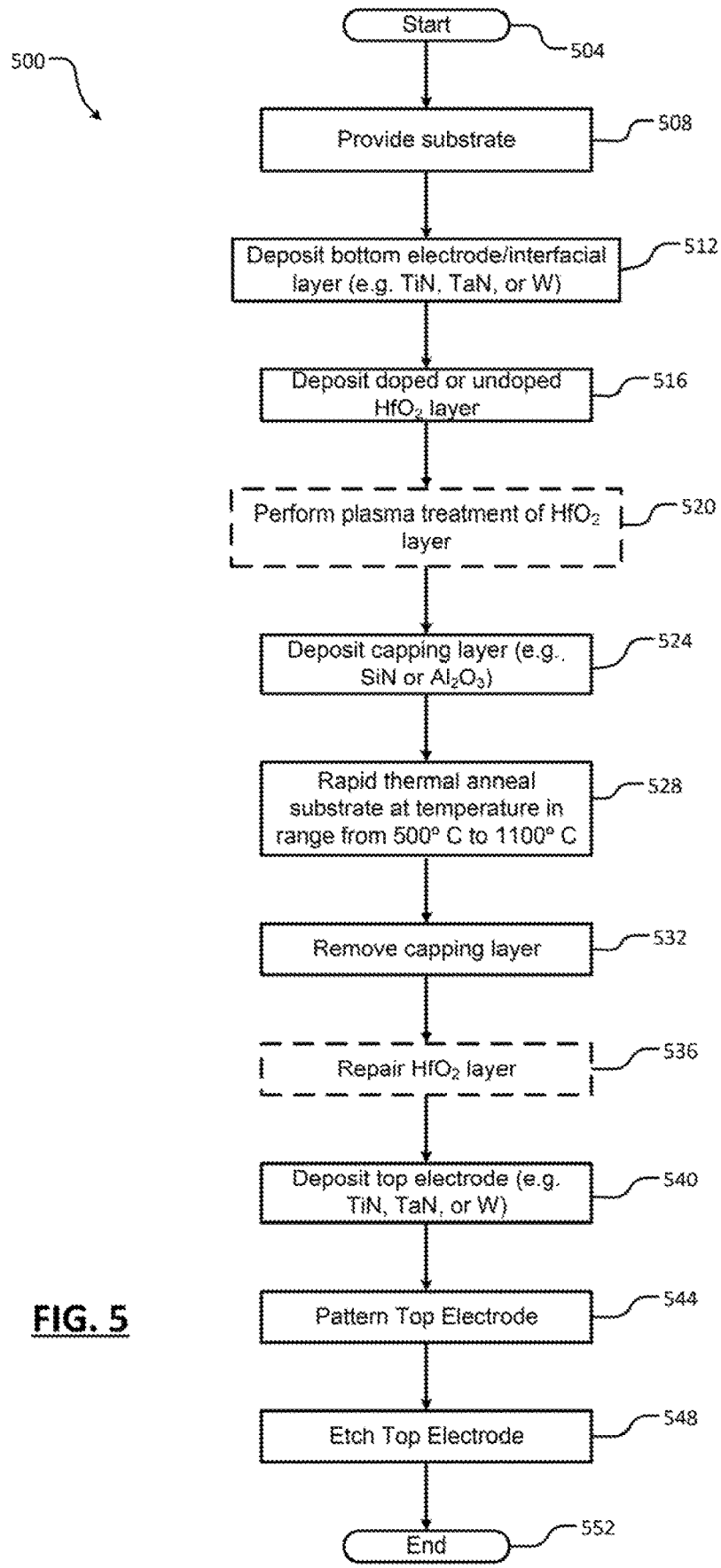
FIG. 5 illustrates an example method for forming a ferroelectric $HfO_2$ layer using a sacrificial capping layer according to the present disclosure.

Referring now to FIG. 5, an example method 500 for forming a ferroelectric $HfO_2$ layer using a sacrificial capping layer according to the present disclosure begins at 504. At 508, a substrate is provided. For example, a substrate including one or more underlying layers is arranged on a substrate support in a substrate processing chamber. At 512, an interfacial layer is deposited on the substrate. The interfacial layer may include silicon dioxide ($SiO_2$) or silicon oxynitride (SiON), and/or may correspond to a bottom electrode including titanium nitride (TiN), tantalum nitride (TaN), or tungsten (W). The interfacial layer may be deposited using atomic layer deposition (ALD), chemical vapor deposition (CVD), or physical vapor deposition (PVD). At 516, a doped or undoped $HfO_2$ layer is deposited on the interfacial layer (e.g., using ALD). At 520, plasma treatment of the $HfO_2$ layer may optionally be performed. For example, the $HfO_2$ layer may be nitridated by plasma including a nitrogen gas species.

At 524, a capping layer (e.g., a sacrificial capping layer) is deposited on the $HfO_2$ layer. For example, the capping layer may include silicon nitride (SiN), silicon dioxide ($SiO_2$), aluminum oxide ($Al_2O_3$), silicon oxynitride ($SiO_xN_y$), aluminum nitride (AlN), aluminum oxynitride ($AlO_xN_y$), tantalum pentoxide ($Ta_2O_5$), tantalum oxynitride ($TaO_xN_y$), titanium oxide ($TiO_2$), titanium oxynitride ($TiO_xN_y$), etc. The capping layer may be deposited using atomic layer deposition (ALD), chemical vapor deposition (CVD), or physical vapor deposition (PVD). At 528, the substrate, interfacial layer, $HfO_2$ layer, and capping layer are annealed at a predetermined temperature in a range from 500° C. to 1100° C. (e.g., from 800° C. to 1000° C.) to form ferroelectric $HfO_2$. At 532, the capping layer is removed (e.g., via dry or wet etching). At 536, one or more additional repair and/or cleaning steps may optionally be performed. For example, the repair steps may include performing one or more $HfO_2$ deposition cycles to deposit additional $HfO_2$ material on the $HfO_2$ layer.

At 540, a top electrode (e.g., TiN, TaN, or W) is deposited on the nitridated $HfO_2$ layer. For example, the top electrode is deposited using atomic layer deposition (ALD), chemical vapor deposition (CVD), or physical vapor deposition (PVD). The top electrode may be patterned at 544 (e.g., a mask may be patterned onto the top electrode) and etched at 548. The method 500 ends at 552.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of forming ferroelectric hafnium oxide ($HfO_2$) in a substrate processing system, the method comprising:
   depositing an $HfO_2$ layer on a substrate;
   depositing a capping layer on the $HfO_2$ layer;
   annealing the $HfO_2$ layer and the capping layer to form ferroelectric hafnium $HfO_2$;
   selectively etching the capping layer to remove the capping layer without removing the $HfO_2$ layer;
   repairing the $HfO_2$ layer subsequent to selectively etching the capping layer, by performing one or more cycles of additional $HfO_2$ deposition to deposit a thin $HfO_2$ film on the $HfO_2$ layer to fill cracks in the $HfO_2$ layer; and
   depositing a top electrode on the $HfO_2$ layer subsequent to repairing the $HfO_2$ layer.

2. The method of claim 1, wherein the capping layer comprises a material selected from a group consisting of silicon nitride (SiN), silicon dioxide ($SiO_2$), and aluminum oxide ($Al_2O_3$).

3. The method of claim 1, wherein the capping layer does not include either of titanium and tantalum.

4. The method of claim 1, further comprising nitridating the $HfO_2$ layer prior to depositing the capping layer.

5. The method of claim 1, wherein the top electrode comprises a material selected from a group consisting of titanium, tantalum, and tungsten.

6. The method of claim 1, wherein selectively etching the capping layer includes wet etching the capping layer using a diluted hydrofluoric acid solution.

7. The method of claim 1, wherein selectively etching the capping layer includes dry plasma etching the capping layer using a plasma generated with at least one of a fluorocarbon plasma and a halogen plasma.

8. The method of claim 1, wherein annealing the $HfO_2$ layer and the capping layer to form ferroelectric hafnium $HfO_2$ includes performing a rapid thermal annealing process at a temperature within a range of 500 and 1000° C.

9. The method of claim 1, further comprising depositing a bottom electrode on the substrate, wherein depositing the $HfO_2$ layer includes depositing the $HfO_2$ layer on the bottom electrode.

10. The method of claim 1, further comprising performing a plasma treatment of the $HfO_2$ layer prior to depositing the capping layer.

11. A system configured to form ferroelectric hafnium oxide ($HfO_2$) on a substrate in a processing chamber, the system comprising:
   a gas delivery system configured to supply process gases to the processing chamber;
   a radio frequency (RF) generating system configured to selectively generate plasma within the processing chamber; and
   a controller configured to, by controlling the gas delivery system and the RF generating system,
   deposit an $HfO_2$ layer on the substrate,
   deposit a capping layer on the $HfO_2$ layer,
   anneal the $HfO_2$ layer and the capping layer to form ferroelectric hafnium $HfO_2$,
   selectively etch the capping layer to remove the capping layer without removing the $HfO_2$ layer,
   repair the $HfO_2$ layer subsequent to selectively etching the capping layer, by performing one or more cycles of additional $HfO_2$ deposition to deposit a thin $HfO_2$ film on the $HfO_2$ layer to fill cracks in the $HfO_2$ layer, and
   deposit a top electrode on the $HfO_2$ layer subsequent to repairing the $HfO_2$ layer.

12. The system of claim 11, wherein the capping layer comprises a material selected from a group consisting of silicon nitride (SiN), silicon dioxide ($SiO_2$), and aluminum oxide ($Al_2O_3$).

13. The system of claim 11, wherein the capping layer does not include either of titanium and tantalum.

14. The system of claim 11, wherein the controller is further configured to nitridate the $HfO_2$ layer prior to depositing the capping layer.

15. The system of claim 11, wherein the top electrode comprises a material selected from a group consisting of titanium, tantalum, and tungsten.

16. The system of claim 11, wherein selectively etching the capping layer includes wet etching the capping layer using a diluted hydrofluoric acid solution.

17. The system of claim 11, wherein selectively etching the capping layer includes dry plasma etching the capping layer using a plasma generated with at least one of a fluorocarbon plasma and a halogen plasma.

18. The system of claim 11, wherein annealing the $HfO_2$ layer and the capping layer to form ferroelectric hafnium $HfO_2$ includes performing a rapid thermal annealing process at a temperature within a range of 500 and 1000° C.

19. The system of claim 11, wherein the controller is further configured to deposit a bottom electrode on the substrate, wherein depositing the $HfO_2$ layer includes depositing the $HfO_2$ layer on the bottom electrode.

20. The system of claim 11, wherein the controller is further configured to perform a plasma treatment of the $HfO_2$ layer prior to depositing the capping layer.

* * * * *